United States Patent
Rim et al.

(10) Patent No.: US 9,583,173 B2
(45) Date of Patent: *Feb. 28, 2017

(54) SEMICONDUCTOR SYSTEMS FOR FAST SENSING SPEED AND CORRECT AMPLIFICATION OPERATION

(71) Applicant: SK hynix Inc., Icheon-si, Gyeonggi-do (KR)

(72) Inventors: A Ram Rim, Seoul (KR); Ho Uk Song, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/808,163

(22) Filed: Jul. 24, 2015

(65) Prior Publication Data
US 2016/0307616 A1    Oct. 20, 2016

(30) Foreign Application Priority Data

Apr. 14, 2015   (KR) .................. 10-2015-0052728

(51) Int. Cl.
| | |
|---|---|
| G11C 7/00 | (2006.01) |
| G11C 11/4074 | (2006.01) |
| G11C 11/4076 | (2006.01) |
| G11C 11/4093 | (2006.01) |
| G11C 11/4096 | (2006.01) |
| G11C 11/408 | (2006.01) |
| G11C 11/406 | (2006.01) |
| G11C 11/4091 | (2006.01) |

(52) U.S. Cl.
CPC ........ *G11C 11/4074* (2013.01); *G11C 11/406* (2013.01); *G11C 11/4076* (2013.01); *G11C 11/4087* (2013.01); *G11C 11/4091* (2013.01); *G11C 11/4093* (2013.01); *G11C 11/4096* (2013.01)

(58) Field of Classification Search
None
See application file for complete search history.

(56) References Cited

U.S. PATENT DOCUMENTS

2009/0059701 A1* 3/2009 Byeon ............... G11C 5/147
                                                    365/205
2009/0154275 A1    6/2009 Matsumoto
(Continued)

FOREIGN PATENT DOCUMENTS

KR    1020120086067 A    8/2012

*Primary Examiner* — Son Dinh
*Assistant Examiner* — Sultana Begum
(74) *Attorney, Agent, or Firm* — William Park & Associates Ltd.

(57) ABSTRACT

A semiconductor device may include a power control signal generator and a sense amplifier circuit. The power control signal generator may generate a first power control signal, an enablement moment of the first power control signal controlled according to a logic level combination of temperature code signals in response to a mode signal. The sense amplifier circuit may generate a first power signal driven in response to the first power control signal and may generate a second power signal driven in response to a second power control signal. The sense amplifier circuit may sense and amplify a level of a bit line using the first power signal and the second power signal.

16 Claims, 15 Drawing Sheets

(56) References Cited

U.S. PATENT DOCUMENTS

2012/0039133 A1* 2/2012 Kadowaki ............ G11C 11/406
                                                              365/189.05
2015/0348611 A1* 12/2015 Rim .................... G11C 11/4074
                                                              365/222
2015/0380074 A1* 12/2015 Choi ........................ G11C 7/04
                                                              365/189.011

* cited by examiner

SEMICONDUCTOR SYSTEMS FOR FAST SENSING SPEED AND CORRECT AMPLIFICATION OPERATION

CROSS-REFERENCE TO RELATED APPLICATION

The present application claims priority under 35 U.S.C 119(a) to Korean Application No. 10-2015-0052728, filed on Apr. 14, 2015, in the Korean Intellectual Property Office, which is incorporated herein by reference in its entirety as set forth in full.

BACKGROUND

1. Technical Field

Various embodiments generally relate to a semiconductor system, and more particularly, to a semiconductor system including a semiconductor device.

2. Related Art

In general, a semiconductor memory device such as a dynamic random access memory (DRAM) device includes a plurality of memory cells. Each of the DRAM cells are configured including a single cell transistor and a single cell capacitor. The pluralities of DRAM cells are disposed at respective ones of intersections of a plurality of word lines and a plurality of bit lines. When the DRAM device operates in a read mode, one of the word lines is selectively enabled to transfer electric charges stored in the cell capacitors of the DRAM cells connected to the selected word line onto the bit lines, and signals corresponding to the electric charges on the bit lines are amplified by sense amplifiers connected to the bit lines. The bit lines are pre-charged before the selected word line is enabled. The sense amplifiers are driven by a power supply voltage. The power supply voltage is higher than an internal voltage to obtain a fast sensing speed and a correct amplification operation thereof. This is referred to as an over driving operation.

SUMMARY

According to an embodiment, a semiconductor device may be provided. The semiconductor device may include a power control signal generator and a sense amplifier circuit. The power control signal generator may generate a first power control signal. The enablement moment of the first power control signal may be controlled according to a logic level combination of temperature code signals in response to a mode signal. The sense amplifier circuit may generate a first power signal driven in response to the first power control signal. The sense amplifier circuit may generate a second power signal driven in response to second power control signal. The sense amplifier circuit may sense and amplify a level of a bit line using the first power signal and the second power signal.

According to an embodiment, a semiconductor device may be provided. The semiconductor device may include a power control signal generator and a sense amplifier circuit. The power control signal generator may generate a first power control signal. The enablement moment of the first power control signal may be controlled according to a logic level combination of temperature code signals in response to a mode signal. The sense amplifier circuit may generate a first power signal driven in response to the first power control signal. The sense amplifier circuit may generate a second power signal driven in response to second power control signal and a third power control signal. The sense amplifier circuit may sense and amplify a level of a bit line using the first power signal and the second power signal.

According to an embodiment, a semiconductor system may be provided. The semiconductor system may include a controller and a semiconductor. The controller may output command signals and temperature code signals. The semiconductor device may generate a first power control signal. The enablement moment of the first power control signal may be controlled according to a logic level combination of temperature code signals in response to a mode signal generated by decoding the command signals. The semiconductor device may generate a first power signal driven in response to the first power control signal. The semiconductor device may generate a second power signal driven in response to a second power control signal. The semiconductor device may sense and amplify a level of a bit line using the first power signal and the second power signal.

According to an embodiment, a semiconductor device may be provided. The semiconductor device may include a temperature flag selector, a delay control signal generator, a power control signal delay unit and a sense amplifier circuit. The temperature flag selector may output one of a first temperature code signal and a second temperature code signal as a temperature flag signal in response to a temperature input control signal and a temperature selection signal. The delay control signal generator may buffer the temperature flag signal in response to a first test mode signal and a second test mode signal to generate a first delay control signal and a second delay control signal. The power control signal delay unit may generate a retarded first power control signal and a retarded second power control signal in response to the first delay control signal and the second delay control signal to generate a first delay power control signal and a second delay power control signal. The sense amplifier circuit may generate a first power signal driven in response to the first delay power control signal and may generate a second power signal driven in response to the second delay power control signal. The sense amplifier circuit may sense and amplify a level of a bit line using the first power signal and the second power signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices and semiconductor systems including the same.

Figure 1:
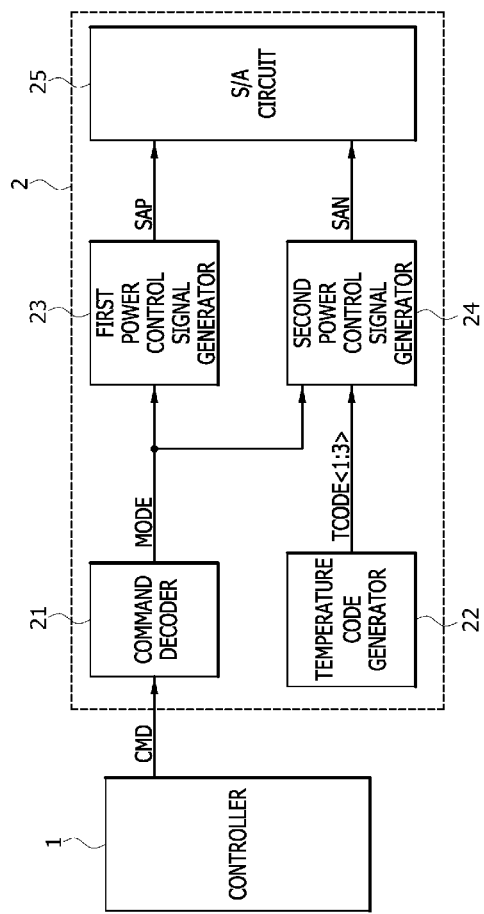
FIG. 1 is a block diagram illustrating a representation of an example of a semiconductor system according to an embodiment.

Referring to FIG. 1, a semiconductor system according to an embodiment may include a controller 1 and a semiconductor device 2. The semiconductor device 2 may include a command decoder 21, a temperature code generator 22, and first power control signal generator 23. The semiconductor device 2 may include second power control signal generator 24 and a sense amplifier (S/A) circuit 25.

The controller 1 may generate command signals CMD and may apply the command signals CMD to the semiconductor device 2. The command signals CMD may be transmitted to the semiconductor device 2 through transmission lines (not illustrated) or other signal lines according to the embodiments. Although not illustrated in the drawings, address signals may be transmitted from the controller 1 to the semiconductor device 2 through the transmission lines or the other signal lines according to the different embodiments.

The command decoder 21 may decode the command signals CMD to generate a mode signal MODE. The mode signal MODE may be a signal enabled during one of, for example, a read operation, a write operation and a refresh operation. A logic level of the enabled mode signal MODE may be set to be different according to the various embodiments.

The temperature code generator 22 may generate temperature code signals TCODE<1:3> including information on the internal temperature of the semiconductor device 2. The temperature code signals TCODE<1:3> may be set to have a logic level combination corresponding to one of various ranges of the internal temperature. For example, the temperature code signals TCODE<1:3> may be set to have a logic level combination of "001" if the internal temperature is higher than first predetermined temperature. For example, the temperature code signals TCODE<1:3> may be set to have a logic level combination of "010" if the internal temperature is within a range of the first predetermined temperature to second predetermined temperature. For example, the temperature code signals TCODE<1:3> may be set to have a logic level combination of "100" if the internal temperature is lower than the second predetermined temperature. In an embodiment, the first predetermined temperature may be set higher than the second predetermined temperature. The internal temperature corresponding to the first and second predetermined temperatures may be set differently according to the various embodiments. If the temperature code signals TCODE<1:3> have a logic level combination of "001", the temperature code signal TCODE<1> may have a logic "high(1)" level, the temperature code signal TCODE<2> may have a logic "low(0)" level, and the temperature code signal TCODE<3> may have a logic "low(0)" level. If the temperature code signals TCODE<1:3> have a logic level combination of "100", the temperature code signal TCODE<1> may have a logic "low(0)" level, the temperature code signal TCODE<2> may have a logic "low(0)" level and the temperature code signal TCODE<3> may have a logic "high(1)" level. The number "3" of bits of the temperature code signals TCODE<1:3> and the logic level combinations of the temperature code signals TCODE<1:3> corresponding to the various ranges of the internal temperature may be set to be different according to the different embodiments.

The first power control signal generator 23 may generate a first power control signal SAP in response to the mode signal MODE. The first power control signal generator 23 may generate the first power control signal SAP enabled at predetermined moment in a period where the mode signal MODE is enabled. The first power control signal generator 23 may generate the first power control signal SAP enabled while a level difference between a bit line (BL of FIG. 2) and a complementary bit line (BLB of FIG. 2) is sensed and amplified.

The second power control signal generator 24 may generate second power control signal SAN in response to the mode signal MODE and the temperature code signals TCODE<1:3>. The second power control signal generator 24 may generate the second power control signal SAN. The enablement moment of the second power control signal SAN is controlled according to the temperature code signals TCODE<1:3> while the mode signal MODE is enabled. For example, the second power control signal generator 24 may generate the second power control signal SAN enabled faster than (i.e., before) the first power control signal SAP when the temperature code signals TCODE<1:3> have a first logic level combination corresponding to the internal temperature that is higher than the first predetermined temperature. The second power control signal generator 24 may generate the second power control signal SAN enabled at the same moment with the first power control signal SAP when the temperature code signals TCODE<1:3> have a second logic level combination corresponding to the internal temperature within a range of the first predetermined temperature to the second predetermined temperature. The second power control signal generator 24 may generate the second power control signal SAN enabled later than (i.e., after) the first power control signal SAP when the temperature code signals TCODE<1:3> have a third logic level combination corresponding to the internal temperature that is lower than the second predetermined temperature. The enablement moment of the second power control signal SAN is controlled according to the temperature code signals TCODE<1:3>, the embodiments are not limited thereto. For example, in some embodiments, the enablement moment of the first power control signal SAP may be controlled according to the temperature code signals TCODE<1:3>.

The S/A circuit 25 may sense and amplify a level difference between a bit line (BL of FIG. 2) and a complementary bit line (BLB of FIG. 2) in response to the first power control signal SAP and the second power control signal SAN. For example, the second power control signal SAN may be enabled faster as the internal temperature is higher and the second power control signal SAN may be enabled slower as the internal temperature is lower.

Figure 2:
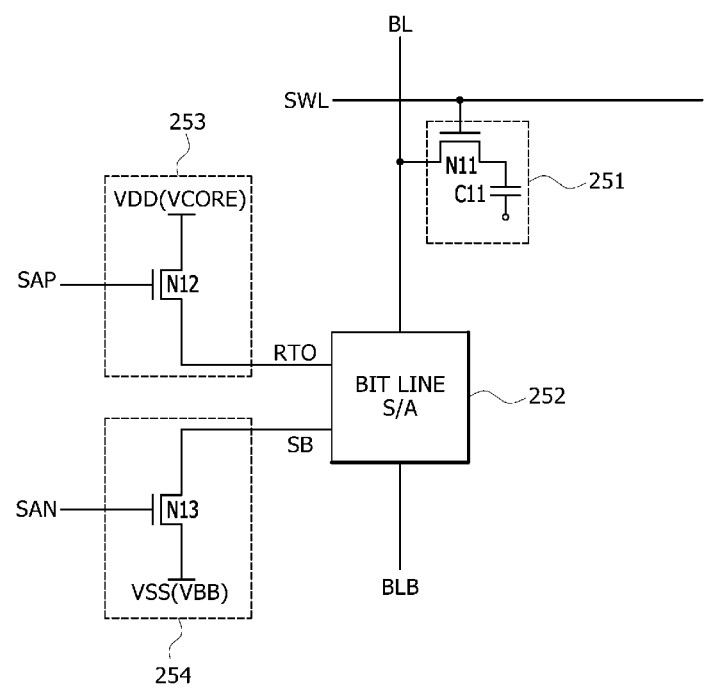
FIG. 2 is a block diagram illustrating a representation of an example of a sense amplifier circuit included in the semiconductor system of FIG. 1.

Referring to FIG. 2, the S/A circuit 25 may include a memory cell 251, a bit line S/A 252, first power signal driver 253 and second power signal driver 254.

The memory cell 251 may include a cell transistor N11 (e.g., an NMOS transistor) and a cell capacitor C11 connected to a source of the cell transistor N11. If, for example, a word line SWL connected to a gate of the cell transistor N11 is selectively enabled to have a logic "high" level while one of the read operation, the write operation or the refresh operation is executed, the cell transistor N11 may be turned on to cause a charge sharing phenomenon between the cell capacitor C11 and the bit line BL connected to a drain of the cell transistor N11.

The bit line S/A 252 may receive the first power signal RTO and the second power signal SB to sense and amplify a level difference between the bit line BL and the complementary bit line BLB. For example, the bit line S/A 252 may sense a minute voltage difference generated between the bit line BL and the complementary bit line BLB due to the charge sharing phenomenon and may amplify the minute voltage difference between the bit line BL and the complementary bit line BLB.

The first power signal driver 253 may include a NMOS transistor N12 that drive the first power signal RTO in response to the first power control signal SAP. The NMOS transistor N12 may be turned on to drive the first power signal RTO to a power voltage VDD while the first power control signal SAP is enabled to have a logic "high" level. In alternate embodiments, the NMOS transistor N12 may drive the first power signal RTO to a core voltage VCORE. The power voltage VDD may be an external voltage supplied from outside the semiconductor device 2. The core voltage VCORE may be an internal voltage supplied to a core region including a memory cell array within the semiconductor device 2.

The second power signal driver 254 may include a NMOS transistor N13 configured to drive the second power signal SB in response to the second power control signal SAN. The NMOS transistor N13 may be turned on to drive the second power signal SB to a ground voltage VSS while the second power control signal SAN is enabled to have a logic "high" level. In alternate embodiments, the NMOS transistor N13 may drive the second power signal SB to a back bias voltage VBB. The ground voltage VSS may be an external voltage supplied from outside the semiconductor device 2. The back bias voltage VBB may be an internal voltage having a level lower than the ground voltage VSS and may be generated by a voltage pumping operation in the semiconductor device 2.

Figure 3:
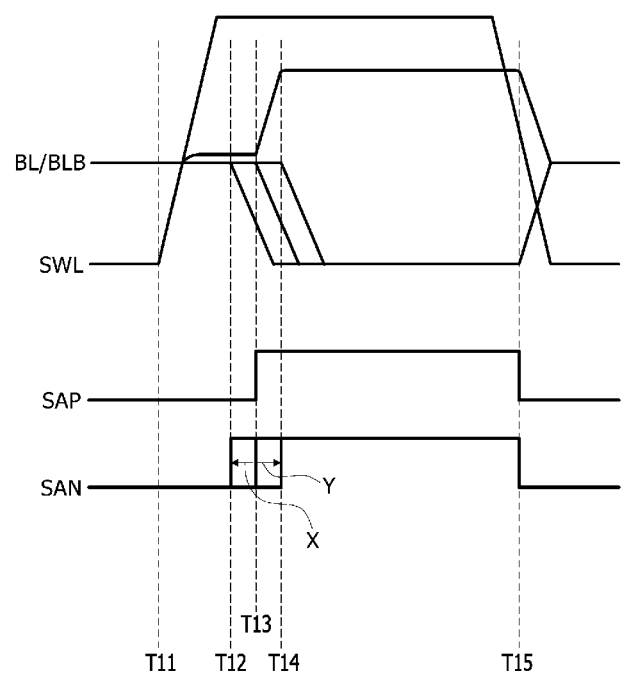
FIG. 3 is timing diagrams illustrating a representation of an example of an operation of the sense amplifier circuit illustrated in FIG. 2.

An example of an operation of the semiconductor device having an aforementioned configuration will be described hereinafter with reference to FIG. 3.

At a point of time "T11", if the word line SWL is enabled to have a logic "high" level to execute any one of the read operation, the write operation or the refresh operation, a minute voltage difference may be generated between the bit line BL and the complementary bit line BLB due to a charge sharing phenomenon.

If the internal temperature is higher than the first predetermined temperature, during a period from a point of time "T12" until a point of time "T15", the second power control signal SAN may be enabled to have a logic "high" level to drive the second power signal SB to the ground voltage VSS. During a period from the point of time "T13" until a point of time "T15", the first power signal RTO may be driven to the power voltage VDD by the first power control signal SAP. The bit line S/A 252 may receive the first power signal RTO driven to the power voltage VDD during a period from a point of time "T13" until a point of time "T15" and the second power signal SB driven to the ground voltage VSS during a period from a point of time "T12" until a point of time "T15" to sense and amplify a voltage difference between the bit line BL and the complementary bit line BLB.

If the internal temperature is within a range of the first predetermined temperature to the second predetermined temperature, during a period from a point of time "T13" until a point of time "T15", the second power control signal SAN may be enabled to have a logic "high" level to drive the second power signal SB to the ground voltage VSS. During a period from the point of time "T13" until a point of time "T15", the first power signal RTO may be driven to the power voltage VDD by the first power control signal SAP. The bit line S/A 252 may receive the first power signal RTO driven to the power voltage VDD during a period from a point of time "T13" until a point of time "T15" and the second power signal SB driven to the ground voltage VSS during a period from a point of time "T13" until a point of time "T15" to sense and amplify a voltage difference between the bit line BL and the complementary bit line BLB.

If the internal temperature is lower than the second predetermined temperature, during a period from a point of time "T14" until a point of time "T15", the second power control signal SAN may be enabled to have a logic "high" level to drive the second power signal SB to the ground voltage VSS. During a period from the point of time "T13" until a point of time "T15", the first power signal RTO may be driven to the power voltage VDD by the first power control signal SAP. The bit line S/A 252 may receive the first power signal RTO driven to the power voltage VDD during a period from a point of time "T13" until a point of time "T15" and the second power signal SB driven to the ground voltage VSS during a period from a point of time "T14" until a point of time "T15" to sense and amplify a voltage difference between the bit line BL and the complementary bit line BLB.

As described with reference to FIGS. 1 to 3, a semiconductor system may control a moment that the second power signal SB supplied to the bit line S/A 252 is driven according to a variation of the internal temperature. For example, the moment that the second power signal SB is driven may be shifted to a X direction at a point of time "T13" as a temperature rises and a Y direction at a point of time "T13" as a temperature is lowered. Experimentally, a characteristic of a write recovery time tWR may be improved as the first power signal RTO is driven before the second power signal SB and a refresh characteristic may be improved as the second power signal SB is driven before the first power signal RTO. Thus, the semiconductor system according to the various embodiments may improve the refresh characteristic because the second power signal SB is driven before the first power signal RTO as a temperature rises. The semiconductor system according to the various embodiments may improve the characteristic of a write recovery time tWR because the first power signal RTO is driven before the second power signal SB as a temperature is lowered.

In an embodiment, the first power signal RTO may be driven before the second power signal SB as a temperature rises and the second power signal SB may be driven before the first power signal RTO as a temperature is lowered.

Figure 4:
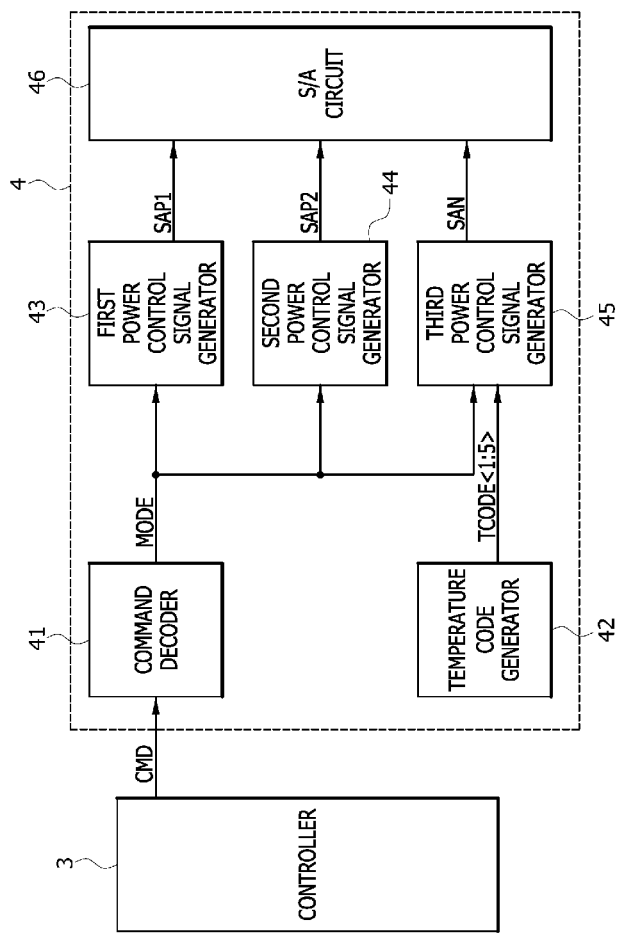
FIG. 4 is a block diagram illustrating a representation of an example of a semiconductor system according to an embodiment.

Referring to FIG. 4, a semiconductor system according to an embodiment may include a controller 3 and a semiconductor device 4. The semiconductor device 4 may include a command decoder 41, a temperature code generator 42, and a first power control signal generator 43. The semiconductor device 4 may include a second power control signal generator 44, a third power control signal generator 45 and a sense amplifier (S/A) circuit 46.

The controller 3 may generate command signals CMD and may apply the command signals CMD to the semiconductor device 4. The command signals CMD may be transmitted to the semiconductor device 4 through transmission lines (not illustrated) or other signal lines according to the various embodiments. Although not illustrated in the drawings, address signals may also be transmitted from the controller 3 to the semiconductor device 4 through the transmission lines or the other signal lines according to the various embodiments.

The command decoder 41 may decode the command signals CMD to generate a mode signal MODE. The mode signal MODE may be a signal enabled during one of a read operation, a write operation or a refresh operation. A logic level of the enabled mode signal MODE may be set to be different according to the different embodiments.

The temperature code generator 42 may generate temperature code signals TCODE<1:5> including information on the internal temperature of the semiconductor device 4. The temperature code signals TCODE<1:5> may be set to have a logic level combination corresponding to one of various ranges of the internal temperature. For example, the temperature code signals TCODE<1:5> may be set to have a logic level combination of "00001" if the internal temperature is higher than first predetermined temperature. For example, the temperature code signals TCODE<1:5> may be set to have a logic level combination of "00010" if the internal temperature is within a range of the first predetermined temperature to second predetermined temperature. For example, the temperature code signals TCODE<1:5> may be set to have a logic level combination of "00100" if the internal temperature is within a range of the second predetermined temperature to third predetermined temperature. For example, the temperature code signals TCODE<1:5> may be set to have a logic level combination of "01000" if the internal temperature is within a range of the third predetermined temperature to fourth predetermined temperature. For example, the temperature code signals TCODE<1:5> may be set to have a logic level combination of "10000" if the internal temperature is lower than the fourth predetermined temperature. In an embodiment, the first predetermined temperature may be set higher than the second predetermined temperature, the second predetermined temperature may be set higher than the third predetermined temperature and the third predetermined temperature may be set higher than the fourth predetermined temperature. The internal temperature corresponding to the first to fourth predetermined temperatures may be set differently according to the various embodiments. If, for example, the temperature code signals TCODE<1:5> have a logic level combination of "00001", the temperature code signal TCODE<1> may have a logic "high(1)" level, the temperature code signal TCODE<2> may have a logic "low(0)" level, the temperature code signal TCODE<3> may have a logic "low(0)" level, the temperature code signal TCODE<4> may have a logic "low(0)" level, and the temperature code signal TCODE<5> may have a logic "low(0)" level. For example, if the temperature code signals TCODE<1:5> have a logic level combination of "01000", the temperature code signal TCODE<1> may have a logic "low(0)" level, the temperature code signal TCODE<2> may have a logic "low(0)" level, the temperature code signal TCODE<3> may have a logic "low(0)" level, the temperature code signal TCODE<4> may have a logic "high(1)" level, and the temperature code signal TCODE<5> may have a logic "low(0)" level. The number "5" of bits of the temperature code signals TCODE<1:5> and the logic level combinations of the temperature code signals TCODE<1:5> corresponding to the various ranges of the internal temperature may be set differently according to the different embodiments.

The first power control signal generator 43 may generate a first power control signal SAP1 in response to the mode signal MODE. The first power control signal generator 43 may generate the first power control signal SAP1 enabled at predetermined moment in a period where the mode signal MODE is enabled. The first power control signal generator 43 may generate the first power control signal SAP1 enabled while a bit line (BL of FIG. 5) and a complementary bit line (BLB of FIG. 5) are over-driven.

The second power control signal generator 44 may generate a second power control signal SAP2 in response to the mode signal MODE. The second power control signal generator 44 may generate the second power control signal SAP2 enabled during a period from a moment that the first power control signal SAP1 is disabled to a moment that the mode signal MODE is disabled. The second power control signal generator 44 may generate the second power control signal SAP2 enabled during a period from a moment that over-driving is terminated to a moment that sensing and amplifying a bit line (BL of FIG. 5) and a complementary bit line (BLB of FIG. 5) are terminated.

The third power control signal generator 45 may generate a third power control signal SAN in response to the mode signal MODE and the temperature code signals TCODE<1:5>. The third power control signal generator 45 may generate the third power control signal SAN. The enablement moment of the third power control signal SAN is controlled according to the temperature code signals TCODE<1:5> while the mode signal MODE is enabled. For example, the third power control signal generator 45 may generate the third power control signal SAN enabled before the first power control signal SAP1 when the temperature code signals TCODE<1:5> have a first logic level combination corresponding to the internal temperature that is higher than the first predetermined temperature. The third power control signal generator 45 may generate the third power control signal SAN enabled at the same moment with the first power control signal SAP1 when the temperature code signals TCODE<1:5> have a second logic level combination corresponding to the internal temperature within a range of the first predetermined temperature to the second predetermined temperature. The third power control signal generator 45 may generate the third power control signal SAN enabled at a moment between the enablement moment of the first power control signal SAP1 and the enablement moment of the second power control signal SAP2 when the temperature code signals TCODE<1:5> have a third logic level combination corresponding to the internal temperature within a range of the second predetermined temperature to the third predetermined temperature. The third power control signal generator 45 may generate the third power control signal SAN enabled at the same moment with the second power control signal SAP2 when the temperature code signals TCODE<1:5> have a fourth logic level combination corresponding to the internal temperature within a range of the third predetermined temperature to the fourth predetermined temperature. The third power control signal generator 45 may generate the third power control signal SAN enabled at a later moment than the second power control signal SAP2 when the temperature code signals TCODE<1:5> have a fifth logic level combination corresponding to the internal temperature that is lower than the fourth predetermined temperature. The enablement moment of the third power control signal SAN may be controlled according to the temperature code signals TCODE<1:5>, however the embodiments are not limited thereto. For example, in some embodiments, the enablement moment of the first power control signal SAP1 or the second power control signal SAP2 may be controlled according to the temperature code signals TCODE<1:5>.

The S/A circuit 46 may sense and amplify a level difference between a bit line (BL of FIG. 5) and a complementary bit line (BLB of FIG. 5) in response to the first power control signal SAP1, the second power control signal SAP2 and the third power control signal SAN. For example, the third power control signal SAN may be enabled faster as the internal temperature is higher and the second power control signal SAN may be enabled slower as the internal temperature is lower.

Figure 5:
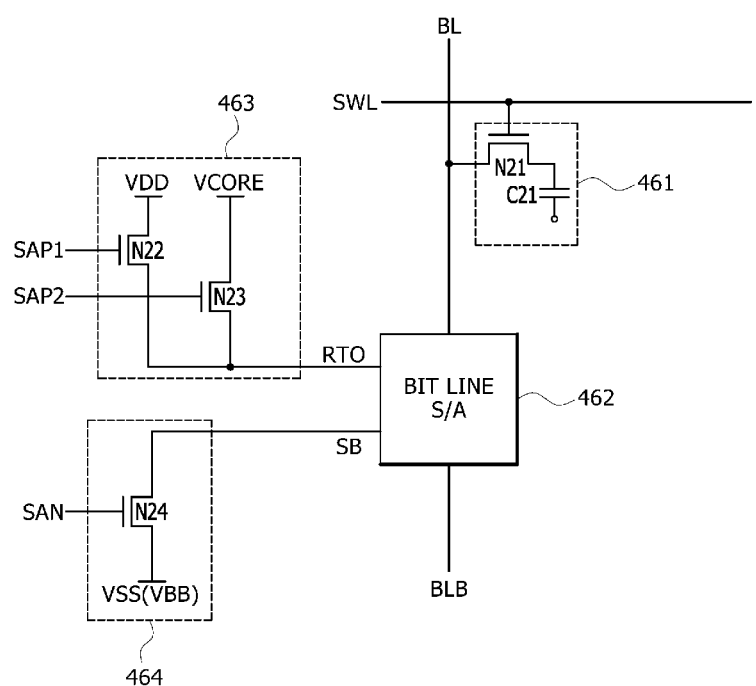
FIG. 5 is a block diagram illustrating a representation of an example of a sense amplifier circuit included in the semiconductor system of FIG. 4.

Referring to FIG. 5, the S/A circuit 46 may include a memory cell 461, a bit line S/A 462, first power signal driver 463 and second power signal driver 464.

The memory cell 461 may include a cell transistor N21 (e.g., an NMOS transistor) and a cell capacitor C21 connected to a source of the cell transistor N21. If a word line SWL connected to a gate of the cell transistor N21 is selectively enabled to have a logic "high" level while one of the read operation, the write operation or the refresh operation is executed, the cell transistor N21 may be turned on to cause a charge sharing phenomenon between the cell capacitor C21 and the bit line BL connected to a drain of the cell transistor N21.

The bit line S/A 462 may receive the first power signal RTO and the second power signal SB to sense and amplify a level difference between the bit line BL and the complementary bit line BLB. For example, the bit line S/A 462 may sense a minute voltage difference generated between the bit line BL and the complementary bit line BLB due to the charge sharing phenomenon and may amplify the minute voltage difference between the bit line BL and the complementary bit line BLB.

The first power signal driver 463 may include NMOS transistors N22 and N23. The NMOS transistors N22 and N23 may drive the first power signal RTO in response to the first power control signal SAP1 and the second power control signal SAP2, respectively. The NMOS transistor N22 may be turned on to drive the first power signal RTO to a power voltage VDD while the first power control signal SAP1 is enabled to have a logic "high" level. In alternate embodiments, the NMOS transistor N23 may be turned on to drive the first power signal RTO to a core voltage VCORE while the second power control signal SAP2 is enabled to have a logic "high" level. The power voltage VDD may be an external voltage supplied from outside the semiconductor device 4. The core voltage VCORE may be an internal voltage supplied to a core region including the memory cell array in the semiconductor device 4. The core voltage VCORE may have a lower level than the power voltage VDD.

The second power signal driver 464 may include a NMOS transistor N24. The NMOS transistor N24 may drive the second power signal SB in response to the third power control signal SAN. The NMOS transistor N24 may be turned on to drive the second power signal SB to a ground voltage VSS while the third power control signal SAN is enabled to have a logic "high" level. In alternate embodiments, the NMOS transistor N24 may drive the second power signal SB to a back bias voltage VBB. The ground voltage VSS may be an external voltage supplied from outside the semiconductor device 4. The back bias voltage VBB may be an internal voltage having a level lower than the ground voltage VSS and may be generated by a voltage pumping operation in the semiconductor device 4.

Figure 6:
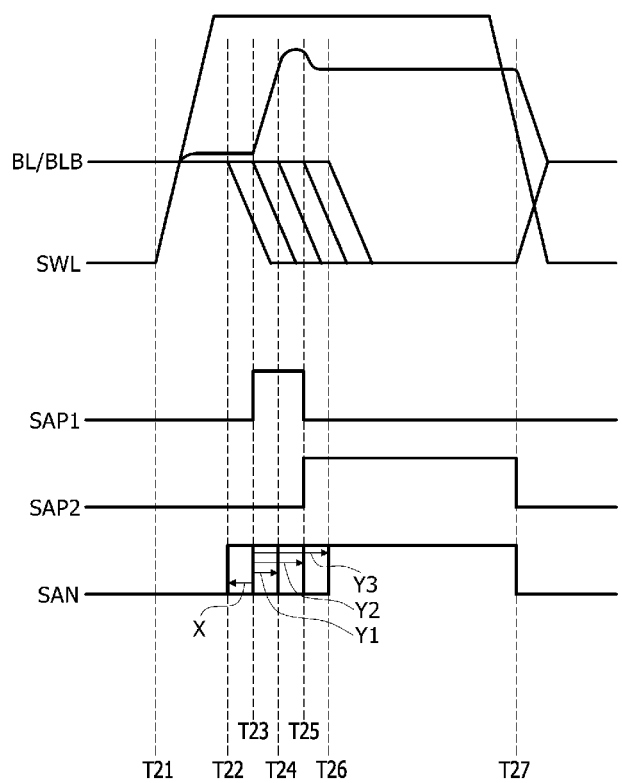
FIG. 6 provides examples of timing diagrams illustrating an operation of the sense amplifier circuit illustrated in FIG. 5.

An example of an operation of the semiconductor device having an aforementioned configuration will be described hereinafter with reference to FIG. 6.

At a point of time "T21", if the word line SWL is enabled to have a logic "high" level to execute any one of the read operation, the write operation or the refresh operation, a minute voltage difference may be generated between the bit line BL and the complementary bit line BLB due to a charge sharing phenomenon.

If the internal temperature is higher than the first predetermined temperature, during a period from a point of time "T22" until a point of time "T27", the third power control signal SAN may be enabled to have a logic "high" level to drive the second power signal SB to the ground voltage VSS. During a period from the point of time "T23" until a point of time "T25", the first power signal RTO may be driven to the power voltage VDD by the first power control signal SAP1. During a period from the point of time "T25" until a point of time "T27", the first power signal RTO may be driven to the core voltage VCORE by the second power control signal SAP2. The bit line S/A 462 may receive the first power signal RTO and the second power signal SB to sense and amplify a voltage difference between the bit line BL and the complementary bit line BLB.

If the internal temperature is within a range of the first predetermined temperature to the second predetermined temperature, during a period from a point of time "T23" until a point of time "T27", the third power control signal SAN may be enabled to have a logic "high" level to drive the second power signal SB to the ground voltage VSS. During a period from the point of time "T23" until a point of time "T25", the first power signal RTO may be driven to the power voltage VDD by the first power control signal SAP1. During a period from the point of time "T25" until a point of time "T27", the first power signal RTO may be driven to the core voltage VCORE by the second power control signal SAP2. The bit line S/A 462 may receive the first power signal RTO and the second power signal SB to sense and amplify a voltage difference between the bit line BL and the complementary bit line BLB.

If the internal temperature is within a range of the second predetermined temperature to the third predetermined temperature, during a period from a point of time "T24" until a point of time "T27", the third power control signal SAN may be enabled to have a logic "high" level to drive the second power signal SB to the ground voltage VSS. During a period from the point of time "T23" until a point of time "T25", the first power signal RTO may be driven to the power voltage VDD by the first power control signal SAP1. During a period from the point of time "T25" until a point of time "T27", the first power signal RTO may be driven to the core voltage VCORE by the second power control signal SAP2. The bit line S/A 462 may receive the first power signal RTO and the second power signal SB to sense and amplify a voltage difference between the bit line BL and the complementary bit line BLB.

If the internal temperature is within a range of the third predetermined temperature to the fourth predetermined temperature, during a period from a point of time "T25" until a point of time "T27", the third power control signal SAN may be enabled to have a logic "high" level to drive the second power signal SB to the ground voltage VSS. During a period from the point of time "T23" until a point of time "T25", the first power signal RTO may be driven to the power voltage VDD by the first power control signal SAP1. During a period from the point of time "T25" until a point of time "T27", the first power signal RTO may be driven to the core voltage VCORE by the second power control signal SAP2. The bit line S/A 462 may receive the first power signal RTO and the second power signal SB to sense and amplify a voltage difference between the bit line BL and the complementary bit line BLB.

If the internal temperature is lower than the fourth predetermined temperature, during a period from a point of time "T26" until a point of time "T27", the third power control signal SAN may be enabled to have a logic "high" level to drive the second power signal SB to the ground voltage VSS. During a period from the point of time "T23" until a point of time "T25", the first power signal RTO may be driven to the power voltage VDD by the first power control signal SAP1. During a period from the point of time "T25" until a point of time "T27", the first power signal RTO may be driven to the core voltage VCORE by the second power control signal SAP2. The bit line S/A 462 may receive the first power signal RTO and the second power signal SB to sense and amplify a voltage difference between the bit line BL and the complementary bit line BLB.

As described with reference to FIGS. 4 to 6, the semiconductor system may control a moment that the second power signal SB supplied to the bit line S/A 252 is driven according to a variation of the internal temperature. That is, the moment that the second power signal SB is driven may be shifted to an X direction at a point of time "T23" as a temperature rises. The moment that the second power signal SB is driven may be shifted to Y1, Y2 and Y3 directions at a point of time "T13" as a temperature is lowered. Experimentally, a characteristic of a write recovery time tWR may be improved as the first power signal RTO is driven before the second power signal SB and a refresh characteristic may be improved as the second power signal SB is driven before the first power signal RTO. Thus, the semiconductor system according to the embodiments may improve the refresh characteristic because the second power signal SB is driven before the first power signal RTO as a temperature rises. The semiconductor system according to the various embodiments may improve the characteristic of a write recovery time tWR because the first power signal RTO is driven before the second power signal SB as a temperature is lowered.

Figure 7:
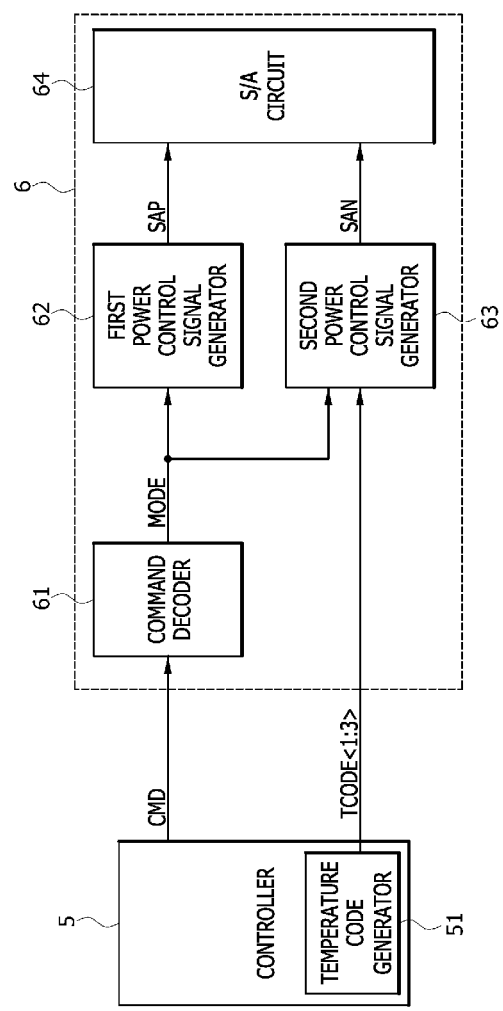
FIG. 7 is a block diagram illustrating a representation of an example of a semiconductor system according to an embodiment.

Referring to FIG. 7, a semiconductor system according to an embodiment may include a controller 5 and a semiconductor device 6. The controller 5 may include a temperature code generator 51. The semiconductor device 6 may include a command decoder 61, first power control signal generator 62, second power control signal generator 63 and a sense amplifier (S/A) circuit 64.

The controller 5 may generate command signals CMD and temperature code signals TCODE<1:3> and may apply the command signals CMD and temperature code signals TCODE<1:3> to the semiconductor device 6. The command signals CMD may be transmitted to the semiconductor device 6 through transmission lines (not illustrated) or other signal lines according to the different embodiments. Similarly, although not illustrated in the drawings, address signals may also be transmitted from the controller 5 to the semiconductor device 6 through the transmission lines or the other signal lines according to the various embodiments.

The temperature code generator 51 may generate temperature code signals TCODE<1:3> including information on the internal temperature of the semiconductor device 6. The temperature code signals TCODE<1:3> may be set to have a logic level combination corresponding to one of various ranges of the internal temperature. For example, the temperature code signals TCODE<1:3> may be set to have a logic level combination of "001" if the internal temperature is higher than first predetermined temperature. For example, the temperature code signals TCODE<1:3> may be set to have a logic level combination of "010" if the internal temperature is within a range of the first predetermined temperature to second predetermined temperature. For example, the temperature code signals TCODE<1:3> may be set to have a logic level combination of "100" if the internal temperature is lower than the second predetermined temperature. In an embodiment, the first predetermined temperature may be set higher than the second predetermined temperature. The internal temperature corresponding to the first and second predetermined temperatures may be set differently according to the various embodiments. If the temperature code signals TCODE<1:3> have a logic level combination of "001", the temperature code signal TCODE<1> may have a logic "high(1)" level, the temperature code signal TCODE<2> may have a logic "low(0)" level, and the temperature code signal TCODE<3> may have a logic "low(0)" level. If the temperature code signals TCODE<1:3> have a logic level combination of "100", the temperature code signal TCODE<1> may have a logic "low(0)" level, the temperature code signal TCODE<2> may have a logic "low(0)" level and the temperature code signal TCODE<3> may have a logic "high(1)" level. The number "3" of bits of the temperature code signals TCODE<1:3> and the logic level combinations of the temperature code signals TCODE<1:3> corresponding to the various ranges of the internal temperature may be set differently according to the various embodiments.

The command decoder 61 may decode the command signals CMD to generate a mode signal MODE. The mode signal MODE may be a signal enabled during one of a read operation, a write operation or a refresh operation. A logic level of the enabled mode signal MODE may be set differently according to the various embodiments.

The first power control signal generator 62 may generate a first power control signal SAP in response to the mode signal MODE. The first power control signal generator 62 may generate the first power control signal SAP enabled at a predetermined moment in a period where the mode signal MODE is enabled. The first power control signal generator 62 may generate the first power control signal SAP enabled while a level difference between a bit line (not illustrated) and a complementary bit line (not illustrated) is sensed and amplified.

The second power control signal generator 63 may generate a second power control signal SAN in response to the mode signal MODE and the temperature code signals TCODE<1:3>. The second power control signal generator 63 may generate the second power control signal SAN. The enablement moment of the second power control signal is controlled according to the temperature code signals TCODE<1:3> while the mode signal MODE is enabled. For example, the second power control signal generator 63 may generate the second power control signal SAN enabled before the first power control signal SAP when the temperature code signals TCODE<1:3> have a first logic level combination corresponding to the internal temperature that is higher than the first predetermined temperature. The second power control signal generator 63 may generate the second power control signal SAN enabled at the same moment with the first power control signal SAP when the temperature code signals TCODE<1:3> have a second logic level combination corresponding to the internal temperature within a range of the first predetermined temperature to the second predetermined temperature. The second power control signal generator 63 may generate the second power control signal SAN enabled at a later moment than the first power control signal SAP when the temperature code signals TCODE<1:3> have a third logic level combination corresponding to the internal temperature that is lower than the second predetermined temperature. The enablement moment of the second power control signal SAN is controlled according to the temperature code signals TCODE<1:3>, the embodiments are not limited thereto. For example, in some embodiments, the enablement moment of the first power control signal SAP may be controlled according to the temperature code signals TCODE<1:3>.

The S/A circuit 64 may sense and amplify a level difference between a bit line (not illustrated) and a complementary bit line (not illustrated) in response to the first power control signal SAP and the second power control signal SAN. For example, the second power control signal SAN may be enabled faster as the internal temperature is higher and the second power control signal SAN may be enabled slower as the internal temperature is lower.

The semiconductor system illustrated in FIG. 7 may control a moment that the second power control signal SAN is enabled according to a variation of the internal temperature. The semiconductor system may have substantially the same configuration as the semiconductor system illustrated in FIG. 1 except that the controller 5 includes the temperature code generator 51 to generate the temperature code signals TCODE<1:3>. Thus, the detailed description of the semiconductor system will be omitted hereinafter.

Figure 8:
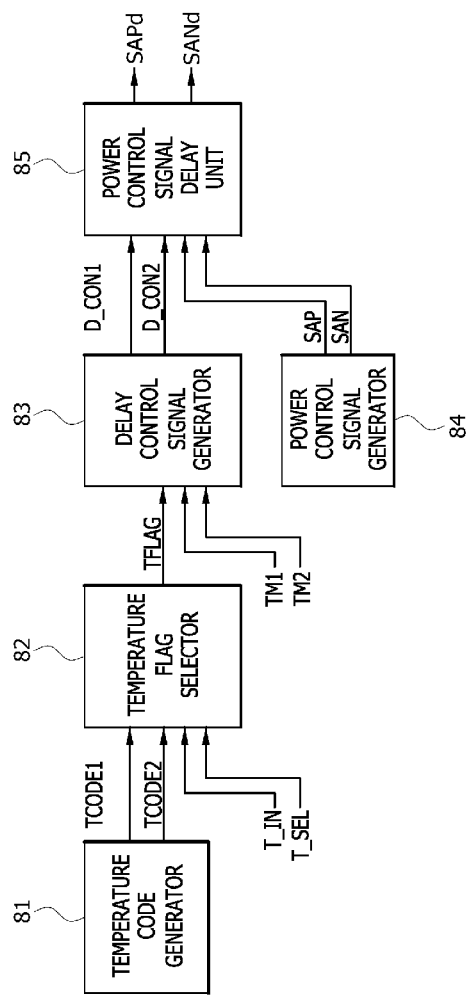
FIG. 8 is a block diagram illustrating a representation of an example of a semiconductor device according to an embodiment.

Referring to FIG. 8, a semiconductor device according to an embodiment may include a temperature code generator 81, a temperature flag selector 82, and a delay control signal generator 83. The semiconductor device may include a power control signal generator 84 and a power control signal delay unit 85.

The temperature code generator 81 may generate a first temperature code signal TCODE1 and a second temperature code signal TCODE2. Each first temperature code signal TCODE1 and second temperature code signal TCODE2 has a code value corresponding to a temperature period including the internal temperature of the semiconductor device. For example, a code value of the first temperature code signal TCODE1 may be set to represent that the internal temperature of the semiconductor device includes a first temperature period (for example, over 70 C.°). A code value of the second temperature code signal TCODE2 may be set to represent that the internal temperature of the semiconductor device includes a second temperature period (for example, over 45 C.° and below 70 C.°). The temperature periods corresponding to the first temperature code signal TCODE1 and the second temperature code signal TCODE2 may be set differently according to the different embodiments.

The temperature flag selector 82 may output one of either the first temperature code signal TCODE1 or the second temperature code signal TCODE2 as a temperature flag signal TFLAG in response to a temperature input control signal T_IN and a temperature selection signal T_SEL. When the temperature input control signal T_IN is enabled, the temperature flag selector 82 may receive and latch the first temperature code signal TCODE1 and the second temperature code signal TCODE2. The temperature input control signal T_IN may be generated by decoding command signals inputted from outside the semiconductor device. For example, the temperature input control signal T_IN may be set to an idle signal enabled when the semiconductor device does not execute any operation. According to the embodiments, the temperature input control signal T_IN may be set to a signal generated in the semiconductor device. The temperature flag selector 82 may output one of either the latched first temperature code signal TCODE1 or the latched second temperature code signal TCODE2 as the temperature flag signal TFLAG in response to the temperature selection signal T_SEL. A level of the temperature selection signal T_SEL may be set according to whether a fuse (not illustrated) included in the semiconductor device is cut or not. According to the embodiments, the temperature selection signal T_SEL may be set to be applied from outside the semiconductor device. A configuration and operation of the temperature flag selector 82 will be described later referring to FIG. 9.

The delay control signal generator 83 may buffer the temperature flag signal TFLAG in response to a first test mode signal TM1 and a second test mode signal TM2 to generate a first delay control signal D_CON1 and a second delay control signal D_CON2. When the first test mode signal TM1 is enabled, the delay control signal generator 83 may buffer the temperature flag signal TFLAG to generate the first delay control signal D_CON1. When the second test mode signal TM2 is enabled, the delay control signal generator 83 may buffer the temperature flag signal TFLAG to generate the second delay control signal D_CON2. The first test mode signal TM1 and the second test mode signal TM2 may be applied from outside the semiconductor device or may be set to be generated from inside the semiconductor device to execute a test operation. A configuration and operation of the delay control signal generator 83 will be described later referring to FIG. 10.

The power control signal generator 84 may generate a first power control signal SAP and a second power control signal SAN enabled while a level difference between a bit line (BL of FIG. 2) and a complementary bit line (BLB of FIG. 2) is sensed and amplified. A period that the first power control signal SAP and the second power control signal SAN are enabled may be set differently according to the various embodiments.

The power control signal delay unit 85 may retard the first power control signal SAP and the second power control signal SAN in response to the first delay control signal D_CON1 and the second delay control signal D_CON2 to generate a first delay power control signal SAPd and a second delay power control signal SANd. The first power signal (RTO of FIG. 2) supplied to the bit line S/A (252 of FIG. 2) may be driven to have the power supply voltage (VDD of FIG. 2) or the core voltage (VCORE of FIG. 2) while in a period where the first delay power control signal SAPd is enabled. The second power signal (SB of FIG. 2) supplied to the bit line S/A (252 of FIG. 2) may be driven to have the ground voltage (VSS of FIG. 2) while in a period where the second delay power control signal SANd is enabled. A method of how the power control signal delay unit 85 retards the first power control signal SAP and the second power control signal SAN using the first delay control signal D_CON1 and the second delay control signal D_CON2 may be set differently according to the various embodiments. A configuration and operation of the power control signal delay unit 85 will be described later referring to FIGS. 11 to 14.

Figure 9:
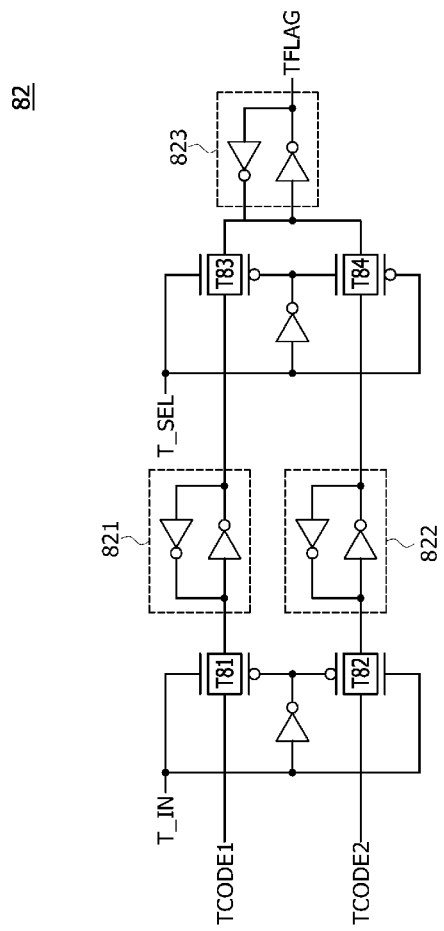
FIG. 9 is a circuit diagram illustrating a representation of an example of a temperature flag selector included in the semiconductor device of FIG. 8.

Referring to FIG. 9, the temperature flag selector 82 may include transfer gates T81, T82, T83 and T84 and latch units 821, 822 and 823. When the temperature input control signal T_IN is enabled, the temperature flag selector 82 (see FIG. 8) may receive the first temperature code signal TCODE1 and the second temperature code signal TCODE2 through the transfer gates T81 and T82. The transfer gates T81 and T82 may be turned on when the temperature input control signal T_IN is enabled. When the temperature input control signal T_IN is enabled, the temperature flag selector 82 (see FIG. 8) may latch the first temperature code signal TCODE1 and the second temperature code signal TCODE2 in the latch units 821 and 822. The temperature flag selector 82 may output one of either the first temperature code signal TCODE1 or the second temperature code signal TCODE2 latched in the latch units 821 and 822 as the temperature flag signal TFLAG according to a level of the temperature selection signal T_SEL. For example, the temperature flag selector 82 may output the first temperature code signal TCODE1 stored in the latch unit 821 as the temperature flag signal TFLAG through the transfer gate T83 turned on and latch unit 823 when the temperature selection signal T_SEL is enabled to have a logic "high" level. For example, the temperature flag selector 82 may output the second temperature code signal TCODE2 stored in the latch unit 822 as the temperature flag signal TFLAG through the transfer gate T84 turned on and latch unit 823 when the temperature selection signal T_SEL is enabled to have a logic "low" level.

Figure 10:
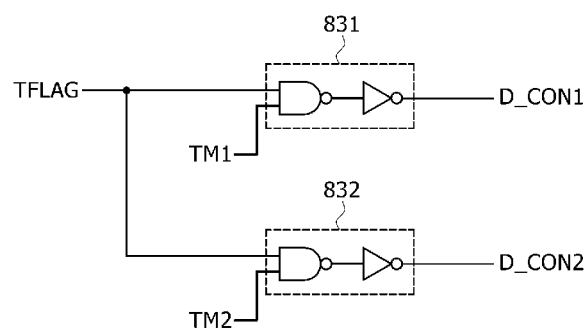
FIG. 10 is a circuit diagram illustrating a representation of an example of a delay control signal generator included in the semiconductor device of FIG. 8.

Referring to FIG. 10, the delay control signal generator 83 may include a first buffer unit 831 and a second buffer unit 832. The first buffer unit 831 may buffer the temperature flag signal TFLAG to generate the first delay control signal D_CON1 when the first test mode signal TM1 is enabled to have a logic "high" level. For example, the first buffer unit 831 may include logic elements. The first buffer unit 831 may include, for example but not limited to, a NAND gate configured to receive the temperature flag signal TFLAG and the first test mode signal TM1. The first buffer unit 831 may include an inverter configured to receive an output of the NAND gate and output the first delay control signal D_CON1. The second buffer unit 832 may buffer the temperature flag signal TFLAG to generate the second delay control signal D_CON2 when the second test mode signal TM2 is enabled to have a logic "high" level. For example, the second buffer unit 832 may include logic elements. The second buffer unit 832 may include, for example but not limited to, a NAND gate configured to receive the temperature flag signal TFLAG and the second test mode signal TM2. The second buffer unit 832 may include an inverter configured to receive an output of the NAND gate and output the second delay control signal D_CON2.

Figure 11:
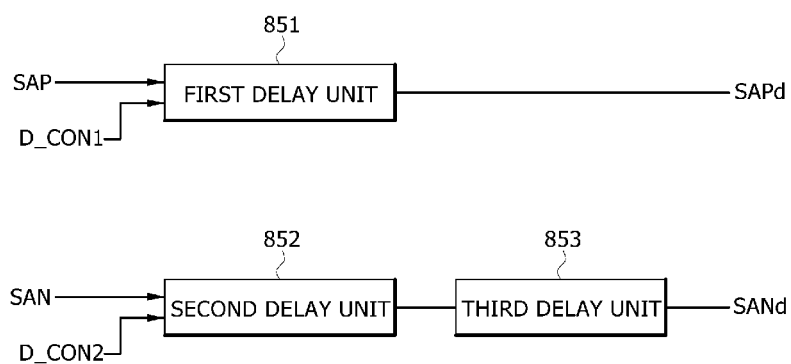
FIG. 11 is a block diagram illustrating a representation of an example of a power control signal delay unit included in the semiconductor device of FIG. 8.

Referring to FIG. 11, the power control signal delay unit 85 may include a first delay unit 851, a second delay unit 852 and a third delay unit 853. The first delay unit 851 may retard the first power control signal SAP by a first delay time in response to the first delay control signal D_CON1 to generate a first delay power control signal SAPd. For example, when the first delay control signal D_CON1 is enabled, the first delay unit 851 may retard the first power control signal SAP by first delay time to output the retarded first power control signal SAP as the first delay power control signal SAPd. For example, when the first delay control signal D_CON1 is disabled, the first delay unit 851 may output the first power control signal SAP as the first delay power control signal SAPd. The second delay unit 852 may retard and output the second power control signal SAN by second delay time in response to the second delay control signal D_CON2. For example, when the second delay control signal D_CON2 is enabled, the second delay unit 852 may retard and output the second power control signal SAN by a second delay time. For example, when the second delay control signal D_CON2 is disabled, the second delay unit 852 may output the second power control signal SAN without retarding the second power control signal SAN. The third delay unit 853 may retard an output signal of the second delay unit 852 by a third delay time to generate the second delay power control signal SANd.

An example of an operation of the power control signal delay unit 85 illustrated in FIG. 11 will be described hereinafter with reference to FIG. 12 in conjunction with a first case CASE1, for example, the first delay control signal D_CON1 has a logic "low" level and the second delay control signal D_CON2 has a logic "low" level. An operation of the power control signal delay unit 85 illustrated in FIG. 11 will be described hereinafter with reference to FIG. 12 in conjunction with a second case CASE2, for example, the first delay control signal D_CON1 has a logic "low" level and the second delay control signal D_CON2 has a logic "high" level. An operation of the power control signal delay unit 85 illustrated in FIG. 11 will be described hereinafter with reference to FIG. 12 in conjunction with a third case CASE3, for example, the first delay control signal D_CON1 has a logic "high" level and the second delay control signal D_CON2 has a logic "low" level.

Figure 12:
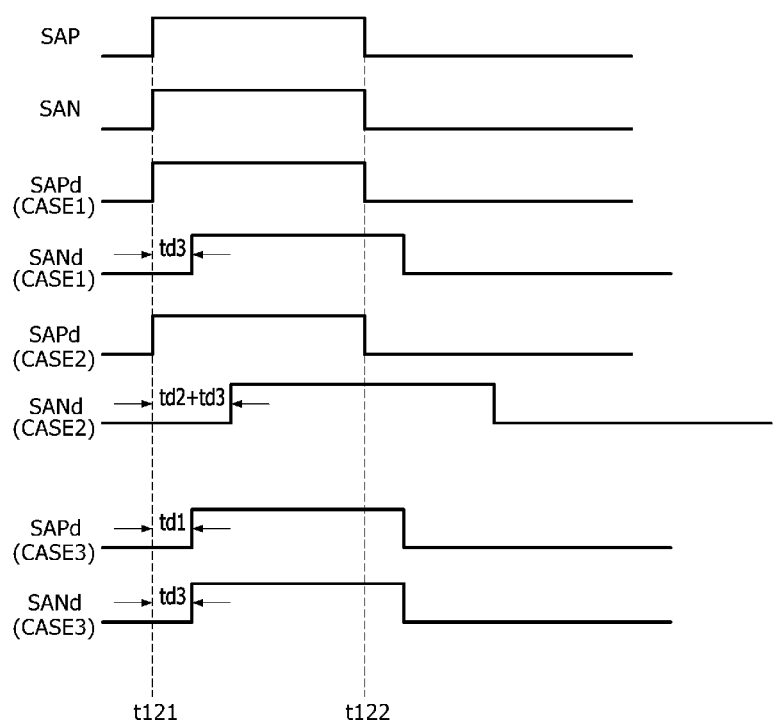
FIG. 12 provides examples of timing diagrams illustrating an operation of the power control signal delay unit illustrated in FIG. 11.

Referring to FIG. 12, for example, the first power control signal SAP and the second power control signal SAN are enabled to have a logic "high" level during a period t121~t122 when the bit line pairs are sensed and amplified.

At the first case CASE1, the first power control signal SAP may be outputted as the first delay power control signal SAPd without retarding the first power control signal SAP because the first delay control signal D_CON1 has a logic "low" level, and the second power control signal SAN may be retarded by the third delay time td3 outputted as the second delay power control signal SANd because the second delay control signal D_CON2 has a logic "low" level.

At the second case CASE2, the first power control signal SAP may be outputted as the first delay power control signal SAPd without retarding the first power control signal SAP because the first delay control signal D_CON1 has a logic "low" level, and the second power control signal SAN may be retarded by the second delay time and the third delay time td2+td3 outputted as the second delay power control signal SANd because the second delay control signal D_CON2 has a logic "high" level.

At the third case CASE3, the first power control signal SAP may be retard by the first delay time td1 outputted as the first delay power control signal SAPd because the first delay control signal D_CON1 has a logic "high" level, and the second power control signal SAN may be retarded by the third delay time td3 outputted as the first delay power control signal SANd because the second delay control signal D_CON2 has a logic "low" level.

Figure 13:
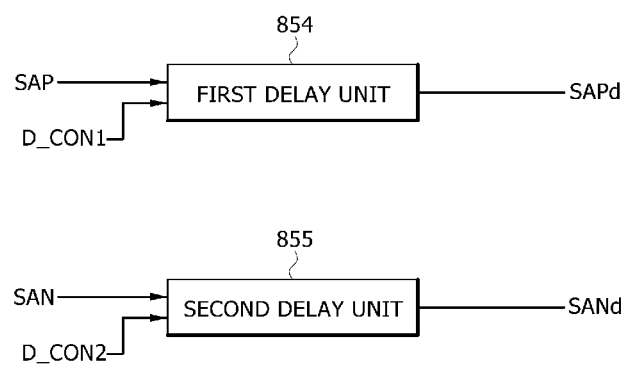
FIG. 13 is a block diagram illustrating a representation of an example of a power control signal delay unit included in the semiconductor device of FIG. 8.

Referring to FIG. 13, the power control signal delay unit 85 may include a first delay unit 854 and a second delay unit 855. The first delay unit 854 may retard the first power control signal SAP by a first delay time in response to the first delay control signal D_CON1 to generate the first delay power control signal SAPd. For example, when the first delay control signal D_CON1 is enabled, the first delay unit 854 may retard the first power control signal SAP by first delay time to output the retarded first power control signal SAP as the first delay power control signal SAPd. For example, when the first delay control signal D_CON1 is disabled, the first delay unit 854 may output the first power control signal SAP as the first delay power control signal SAPd. The second delay unit 855 may retard the second power control signal SAN by second delay time in response to the second delay control signal D_CON2 to output the second delay power control signal SANd. For example, when the second delay control signal D_CON2 is enabled, the second delay unit 855 may retard the second power control signal SAN by second delay time to output the second delay power control signal SANd. For example, when the second delay control signal D_CON2 is disabled, the second delay unit 855 may output the second power control signal SAN as the second delay power control signal SANd without retarding the second power control signal SAN.

An example of an operation of the power control signal delay unit 85 illustrated in FIG. 13 will be described hereinafter with reference to FIG. 14 in conjunction with a first case CASE1, for example, when the first delay control signal D_CON1 has a logic "low" level and the second delay control signal D_CON2 has a logic "low" level. An example of an operation of the power control signal delay unit 85 illustrated in FIG. 13 will be described hereinafter with reference to FIG. 14 in conjunction with a second case CASE2, for example, when the first delay control signal D_CON1 has a logic "low" level and the second delay control signal D_CON2 has a logic "high" level. An example of an operation of the power control signal delay unit 85 illustrated in FIG. 13 will be described hereinafter with reference to FIG. 14 in conjunction with a third case CASE3, for example, when the first delay control signal D_CON1 has a logic "high" level and the second delay control signal D_CON2 has a logic "low" level.

Figure 14:
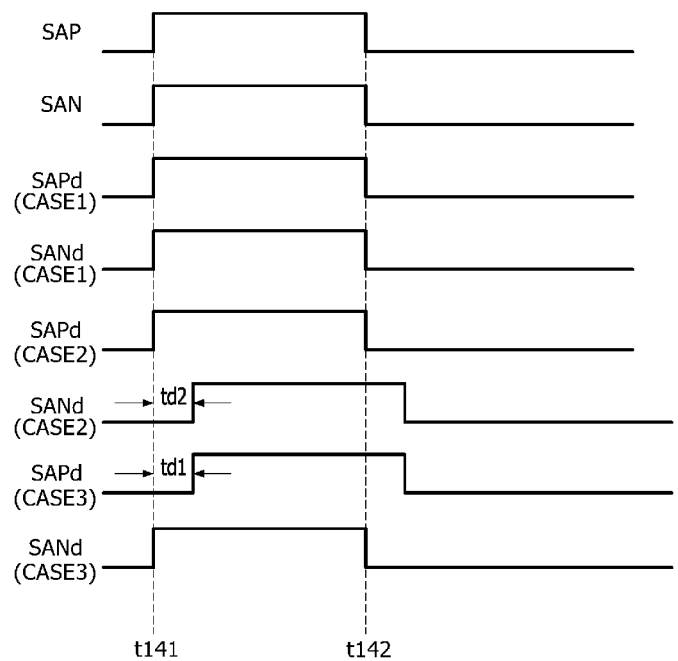
FIG. 14 provides examples of timing diagrams illustrating an operation of the power control signal delay unit illustrated in FIG. 13.

Referring to FIG. 14, for example, the first power control signal SAP and the second power control signal SAN are enabled to have a logic "high" level during a period t121~t122 when the bit line pairs are sensed and amplified.

At the first case CASE1, the first power control signal SAP may be outputted as the first delay power control signal SAPd without retarding the first power control signal SAP because the first delay control signal D_CON1 has a logic "low" level, and the second power control signal SAN may be outputted as the second delay power control signal SANd without retarding the second power control signal SAN because the second delay control signal D_CON2 has a logic "low" level.

At the second case CASE2, the first power control signal SAP may be outputted as the first delay power control signal SAPd without retarding the first power control signal SAP because the first delay control signal D_CON1 has a logic "low" level, and the second power control signal SAN may be retarded by the second delay time td2 outputted as the second delay power control signal SANd because the second delay control signal D_CON2 has a logic "high" level.

At the third case CASE3, the first power control signal SAP may be retarded by the first delay time td1 outputted as the first delay power control signal SAPd because the first delay control signal D_CON1 has a logic "high" level, and the second power control signal SAN may be outputted as the second delay power control signal SANd without retarding the second power control signal SAN because the second delay control signal D_CON2 has a logic "low" level.

Referring to FIGS. 8 to 14, a semiconductor device may control an enablement moment of the first delay power control signal SAPd and the second delay power control signal SANd in response to the first delay control signal D_CON1 and the second delay control signal D_CON2, The logic level combination of the first delay control signal D_CON1 and the second delay control signal D_CON2 are determined according to the first test mode signal TM1 and the second test mode signal TM2. Thus, for example, the first delay power control signal SAPd and the second delay power control signal SANd may be set to be enabled at the same moment, the first delay power control signal SAPd may be set to be enabled before the second delay power control signal SANd or the second delay power control signal SANd may be set to be enabled before the first delay power control signal SAPd.

Figure 15:
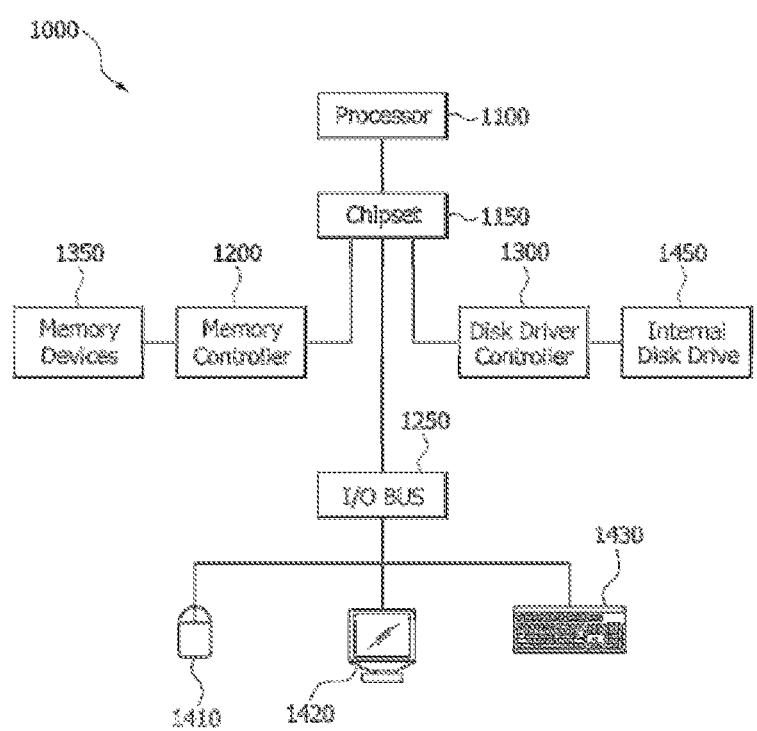
FIG. 15 illustrates a block diagram of an example of a representation of a system employing a semiconductor system and or semiconductor device in accordance with the various embodiments discussed above with relation to FIGS. 1-14.

The semiconductor devices and/or semiconductor systems discussed above (see FIGS. 1-14) are particular useful in the design of memory devices, processors, and computer systems. For example, referring to FIG. 15, a block diagram of a system employing a semiconductor device and/or semiconductor system in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or semiconductor system as discussed above with reference to FIGS. 1-14. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or semiconductor system as discussed above with relation to FIGS. 1-14, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 15 is merely one example of a system 1000 employing a semiconductor device and/or semiconductor system as discussed above with relation to FIGS. 1-14. In alternate embodiments, such as, for example but not limited to, cellular phones or digital cameras, the components may differ from the embodiments illustrated in FIG. 15.

What is claimed is:

1. A semiconductor device comprising:
a power control signal generator suitable for generating a first power control signal, an enablement moment of the first power control signal controlled according to a logic level combination of temperature code signals in response to a mode signal; and
a sense amplifier circuit suitable for generating a first power signal driven in response to the first power control signal and generating a second power signal driven in response to a second power control signal, and sensing and amplifying a level of a bit line using the first power signal and the second power signal.

2. The semiconductor device of claim 1, wherein the temperature code signals have a first logic level combination when an internal temperature is greater than a first predetermined temperature.

3. The semiconductor device of claim 2, wherein the power control signal generator generates the first power control signal enabled before the second power control signal when the temperature code signals have the first logic level combination.

4. The semiconductor device of claim 2, wherein the temperature code signals have a second logic level combination when the internal temperature is within a range of the first predetermined temperature to a second predetermined temperature.

5. The semiconductor device of claim 4, wherein the power control signal generator generates the first power control signal enabled at substantially the same moment with the second power control signal when the temperature code signals have the second logic level combination.

6. The semiconductor device of claim 4, wherein the temperature code signals have a third logic level combination when the internal temperature is lower than the second predetermined temperature.

7. The semiconductor device of claim 6, wherein the power control signal generator generates the first power control signal enabled at a later moment than the second power control signal when the temperature code signals have the third logic level combination.

8. The semiconductor device of claim 1, wherein the mode signal is enabled during one of a read operation, a write operation or a refresh operation.

9. The semiconductor device of claim 1,
wherein the sense amplifier circuit generates the first power signal, the first power signal driven to have a ground voltage in response to the first power control signal after a memory cell is selected by a word line; and
wherein the sense amplifier circuit generates the second power signal, the second power signal driven to have a power voltage in response to the second power control signal.

10. A semiconductor system comprising:
a controller suitable for outputting command signals and temperature code signals; and
a semiconductor device suitable for generating a first power control signal, the enablement moment of the first power control signal controlled according to a logic level combination of temperature code signals in response to a mode signal generated by decoding the command signals, generating a first power signal driven in response to the first power control signal, generating a second power signal driven in response to a second power control signal and sensing and amplifying a level of a bit line using the first power signal and the second power signal.

11. The semiconductor system of claim 10, wherein the temperature code signals have a first logic level combination when an internal temperature is higher than a first predetermined temperature, a second logic level combination when the internal temperature is within a range of the first predetermined temperature to a second predetermined temperature and a third logic level combination when an internal temperature is lower than the second predetermined temperature.

12. The semiconductor system of claim 11, wherein the semiconductor device includes:
a power control signal generator suitable for generating the first power control signal, an enablement moment of the first power control signal controlled according to the logic level combination of the temperature code signals in response to the mode signal; and
a sense amplifier circuit suitable for generating the first power signal driven in response to the first power control signal and generating the second power signal driven in response to the second power control signal, and sensing and amplifying a level of a bit line using the first power signal and the second power signal.

13. The semiconductor system of claim 12, wherein the power control signal generator generates the first power control signal enabled before the second power control signal when the temperature code signals have the first logic level combination.

14. The semiconductor system of claim 12, wherein the power control signal generator generates the first power control signal enabled at substantially the same moment with the second power control signal when the temperature code signals have the second logic level combination.

15. The semiconductor system of claim 12, wherein the power control signal generator generates the first power control signal enabled at a later moment than the second power control signal when the temperature code signals have the third logic level combination.

16. The semiconductor system of claim 12,
wherein the sense amplifier circuit generates the first power signal, the first power signal driven to have a ground voltage in response to the first power control signal after a memory cell is selected by a word line; and
wherein the sense amplifier circuit generates the second power signal, the second power signal driven to have a power voltage in response to the second power control signal.

* * * * *